United States Patent
Chillie et al.

(10) Patent No.: US 9,632,139 B2
(45) Date of Patent: Apr. 25, 2017

(54) IO PAD CIRCUITRY WITH SAFETY MONITORING AND CONTROL FOR INTEGRATED CIRCUITS

(71) Applicant: Scaleo Chip, Valbonne, Sophia Antipolis (FR)

(72) Inventors: Cédric Chillie, Tanneron (FR); Tatiana Kauric, Vallauris (FR)

(73) Assignee: Silicon Mobility, Valbonne/Sophia-Anitpolis (FR)

( * ) Notice: Subject to any disclaimer, the term of this patent is extended or adjusted under 35 U.S.C. 154(b) by 224 days.

(21) Appl. No.: 14/050,077

(22) Filed: Oct. 9, 2013

(65) Prior Publication Data

US 2014/0365814 A1    Dec. 11, 2014

Related U.S. Application Data

(60) Provisional application No. 61/832,814, filed on Jun. 8, 2013.

(51) Int. Cl.
| | | |
|---|---|---|
| *G01R 31/317* | (2006.01) | |
| *H04L 1/00* | (2006.01) | |
| *G06F 11/07* | (2006.01) | |
| *G01R 31/3187* | (2006.01) | |

(52) U.S. Cl.
CPC . *G01R 31/31715* (2013.01); *G01R 31/31713* (2013.01); *H04L 1/00* (2013.01); *G01R 31/3187* (2013.01); *G06F 11/07* (2013.01)

(58) Field of Classification Search
CPC .... G06F 11/08; G06F 11/07; G01R 31/31715
See application file for complete search history.

(56) References Cited

U.S. PATENT DOCUMENTS

| | | | | |
|---|---|---|---|---|
| 4,719,642 A | * | 1/1988 | Lucas | H03M 13/00 375/240.12 |
| 5,742,840 A | * | 4/1998 | Hansen | G06F 9/30 375/E7.019 |
| 5,951,702 A | * | 9/1999 | Lim | G11C 29/04 365/200 |
| 6,058,496 A | | 5/2000 | Gillis et al. | |
| 6,708,238 B1 | | 3/2004 | Rotker | |
| 7,533,311 B2 | | 5/2009 | Tran et al. | |
| 7,664,888 B2 | | 2/2010 | Tran et al. | |
| 7,834,653 B1 | | 11/2010 | Kumar et al. | |
| 8,001,286 B2 | | 8/2011 | Tran et al. | |
| 8,008,935 B1 | | 8/2011 | Baruch et al. | |

(Continued)

*Primary Examiner* — Steve Nguyen
(74) *Attorney, Agent, or Firm* — Blakely Sokoloff Taylor & Zafman LLP

(57) ABSTRACT

An input/output (IO) pad circuitry for integrated circuits (ICs) that is equipped with safety monitoring and control circuits to ensure that signals provided to/from the IO pad behave correctly. The IO pad circuitry allows monitoring of the IO pad signals, the detection of an undesired behavior, e.g., a wrong signal level or a wrong waveform. Furthermore, depending on a selected safety mode, a correction of the IO pad signals by overriding the monitored signal is further achieved. When in full safe mode, signals are provided as required, while in a partial safe mode only certain signals are provided depending on the status. A grouped safe mode allows providing a safe status to a group of IO pads using a single control. A monitoring circuitry between a plurality of input signals to an IC pad is also provided.

11 Claims, 3 Drawing Sheets

(56) References Cited

U.S. PATENT DOCUMENTS

| | | |
|---|---|---|
| 8,086,762 B2 | 12/2011 | Tran et al. |
| 8,164,348 B1 | 4/2012 | Azeroual et al. |
| 2013/0094301 A1 | 4/2013 | Min |
| 2014/0129871 A1* | 5/2014 | Poenaru .................. G06F 11/07 714/2 |

* cited by examiner

IO PAD CIRCUITRY WITH SAFETY MONITORING AND CONTROL FOR INTEGRATED CIRCUITS

CROSS-REFERENCE TO RELATED APPLICATIONS

This application claims the benefit of U.S. Provisional Patent Application No. 61/832,814 filed Jun. 8, 2013.

BACKGROUND OF THE INVENTION

1. Field of the Invention

The invention generally relates to input/output (IO) pads of an integrated circuit (IC) and more particularly to monitor and control signal respective of the IO pads and even more particularly for control of the IO pads for safety purposes.

2. Prior Art

Integrated circuits (ICs) are used in increasing numbers in systems that impact the safety of systems. These include, for example, ICs used in vehicles where there is made an increased use of electronic components to control various functions. Certain of these functions also involve activities that have direct impact on the safety of the vehicle and therefore are critical components and have to be monitored and/or controlled for safe operation at all times. While there are many cases where monitoring of the functionality of an IC is performed there is still a problem that relates to the input/output (IO) pads of the devices. Namely, the IO pads are left alone and in a case of failure of any sorts, while operation may cease or be otherwise controlled, still signals may be present on the IO pads as an input or an output that propagate from the IC to other components of the system, or vice versa, propagate externally from the IC into the functional blocks of the IC further disrupting the operation.

It would be therefore advantageous to provide a solution that will enable the monitoring and control of the IO pads of an IC thereby overcoming deficiencies of prior art implementations.

BRIEF DESCRIPTION OF THE DRAWINGS

The subject matter that is regarded as the invention is particularly pointed out and distinctly claimed in the claims at the conclusion of the specification. The foregoing and other objects, features and advantages of the invention will be apparent from the following detailed description taken in conjunction with the accompanying drawings.

DETAILED DESCRIPTION OF THE PREFERRED EMBODIMENTS

Figure 1:
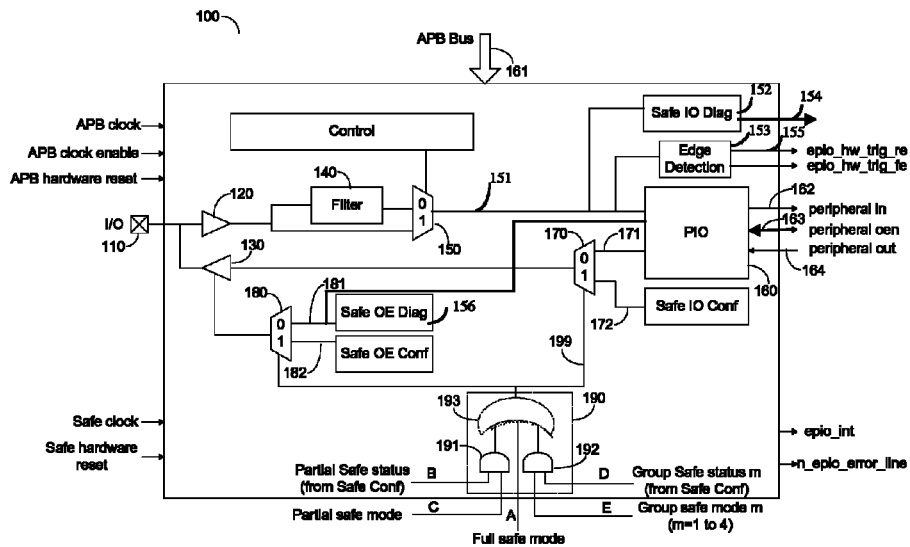
FIG. 1 is a block diagram of an enhanced IO pad circuitry according to an embodiment.

It is important to note that the embodiments disclosed by the invention are only examples of the many advantageous uses of the innovative teachings herein. In general, statements made in the specification of the present application do not necessarily limit any of the various claims. Moreover, some statements may apply to some inventive features but not to others. In general, unless otherwise indicated, singular elements may be in plural and vice versa with no loss of generality. In the drawings, like numerals refer to like parts through several views.

An input/output (IO) pad circuitry for integrated circuits (ICs) that is equipped with safety monitoring and control circuits to ensure that signals provided to/from the IO pad behave correctly. The IO pad circuitry allows monitoring of the IO pad signals, the detection of an undesired behavior, e.g., a wrong signal level or a wrong waveform. Furthermore, depending on a selected safety mode, a correction of the IO pad signals by overriding the monitored signal is further achieved. When in full safe mode, signals are provided as required, while in a partial safe mode only certain signals are provided depending on the status. A grouped safe mode allows providing a safe status to a group of IO pads using a single control. A monitoring circuitry between a plurality of input signals to an IC pad is also provided.

According to the invention IO pads may be configured into various safe modes. A full safe mode where all IO levels and directions are driven by a configured safe value prior to any configuration mode; a partial safe mode where only specific IOs which are intended to be driven by a safe value commutes after a configuration, and these specific IOs do not switch to safe value immediately; and, a group safe made, where a plurality of IOs that define a group of IO signals that will be driven immediately by a safe value on the actuation of an associated safe group line. Entering each safe mode is triggered upon a detection of an unexpected value on the IO pad.

Reference is now made to FIG. 1 that depicts and exemplary and non-limiting block diagram of an enhanced IO pad circuitry 100 according to an embodiment. An IO pad 110 of an IC is connected to a buffer 120 through which signals on the pad are provided into the IC through the enhanced IO pad circuitry 100. The IO pad 110 is further connected to a buffer 130 that provides signals from within the IC through the enhanced IO pad circuitry 100 to the IO pad 110. The buffer 130 is controlled by a signal from a control multiplexer 180 the operation of which is discussed herein. The buffer 120 is connected to a multiplexer 150 through two paths, one of which includes in the path a filter 140, and that allows the selection of a filtered signal from the IO pad 110 versus a non-filtered signal from the IO pad 110. The filter 140 may include but is not limited to a de-bouncing filter. Under the control of appropriate logic (not shown) either the filtered or the non-filtered input signal is provided to a peripheral IO (PIO) unit 160 that under the control of an advanced peripheral bus (APB) 161 determines the mode of operation of the enhanced IO pad circuitry 100. Respective of the control of APB 161 and the signal from the multiplexer 150 the PIO 160 outputs a peripheral in signal 162, i.e., the signal received from the IO pad 110. The PIO 160 may further receive a peripheral out signal 164 that is to be presented on the output path of the IO pad 110 through the signal 171, the multiplexer 170 and the buffer 130. The PIO 160 may further receive also a peripheral output enable signal 163 to control the output buffer 130 through the signal 181 and the multiplexer 180.

In the output path a multiplexer 170 may receive the output signal on 171 or alternatively a safe IO signal 172 over control signal 199 provided by control circuit 190. The signal 199 further controls multiplexer 180 that controls the buffer 130 to enable or disable a signal from the output path onto the IO pad 110. The multiplexer 180 can provide a control signal under the control of signal 199 from a pad output enable signal 181 or a safe output enable signal 182. The control circuit 190 determines control values based on three kinds of inputs that control the safety mode. The first is the full safe mode provided on signal C. The second is the partial safe mode that is provided on signals A and B where A is a partial safe status signal which is ANDed by AND gate 191 with a partial safe mode signal B. The third is a group safe mode where the enhanced IO pad circuitry 100 being part of a group of IO pads is determined to be in a safe mode, which occurs when the group safe mode status for the group is provided on signal D and the group safe mode signal E for the group is ANDed by AND gate 192. The three signals, i.e., full safe mode and the outputs of the AND gates 191 and 192, are ORed by OR gate 193 to provide the control signal 199. To guarantee a safe behavior of the IO pad, a monitoring of the signal 151 is possible through the Safe IO Diag signal 152 that is configured to detect an undesired signal level value. When an error is detected, an error signal 154 is generated to an external module. More complex sequences are detected by the edge detector 153 that is configured to generate from the signal 151 a pulse on a rising edge signal epio_hw_trig_re signal 155 or a pulse on a falling edge signal epio_hw_trig_re signal 156. Thanks to these signals an external module can monitor and verify a sequence in terms of level and timing. Such a circuit is described in co-pending U.S. patent application Ser. No. 13/653,773, entitled "Real-Time Trigger Sequence Checker", filed on Oct. 17, 2012, assigned to common assignee and referenced herein for all that it contains. The output enable signal 181 can also be monitored thanks to the Safe OE Diag signal 156 that is configured to detect a bad level of an output enable (OE) signal. When an error is detected an error signal is generated to an external module as the Safe IO Diag signal 152. It should be noted that while preferably the circuitry added to the IO pad 110 would be part of the extended design and in proximity of location of the IO pad 110, and even more preferably as a single design element for an IC, other embodiments are possible without departing from the scope of the invention.

Figure 2:
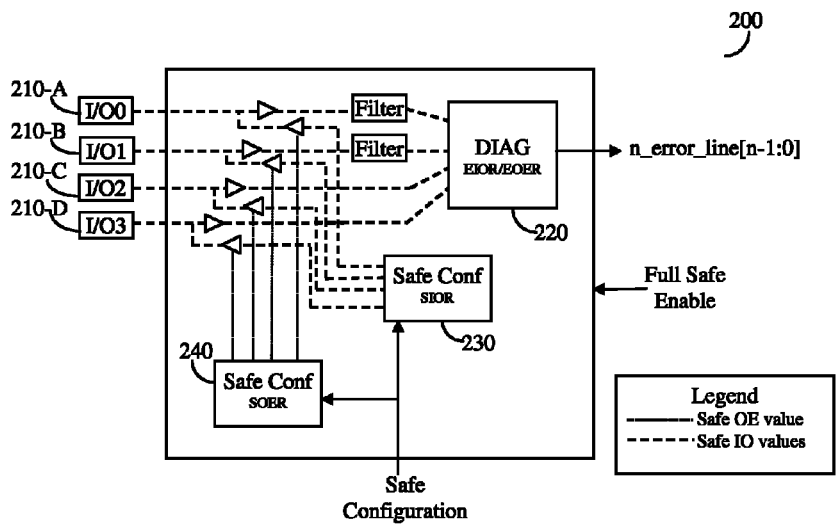
FIG. 2 is an illustrative diagram of operation in full safe mode according to an embodiment.

The operation of an IC in the different modes according to various embodiments is now discussed. In FIG. 2 shows an exemplary and non-limiting illustrative diagram 200 of operation in full safe mode according to an embodiment. Four IO pads 210-A through 210-D, each referring to an IO pad 110 of FIG. 1, of an IC are all working in safe mode under the control of safe output enable signals of safe output enable register (SOER) 240 that control the output paths for these IO pads. The safe signals of the safe IO register (SIOR) 230 are provided to each of these buffers. The signals provided by registers 230 and 240 are similar in function to the signals 172, 181 and 182 shown in FIG. 1. A diagnostic unit 220 monitors the input paths of each of these output signals, filtered as in the case shown for IO pads 210-A and 210-B, and non-filtered as shown in the case of IO pads 210-C and 210-D. The signals from 230 are safe IO values and the signals from 240 are safe output enable values. The diagnostic unit 220 is similar in function to unit 152 shown in FIG. 1. The differences between FIG. 1 and FIG. 2 are merely due to the fact that FIG. 1 shows an embodiment of a single IO pad 110, while FIG. 2 shows a plurality of IO pads 210-A through 210-D.

Figure 3:
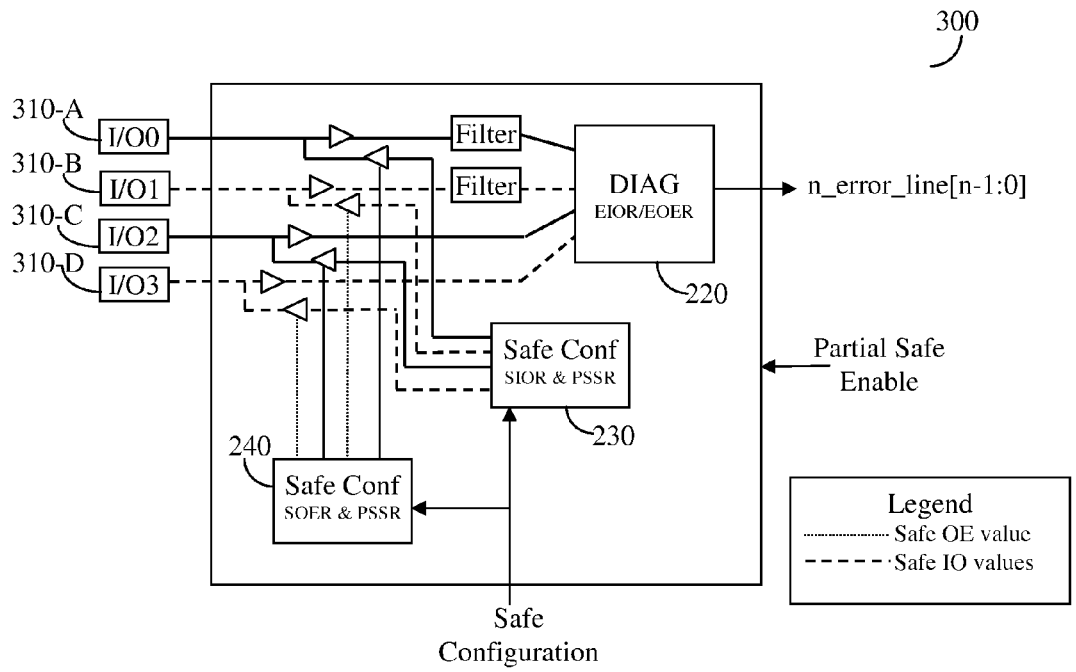
FIG. 3 is an illustrative diagram of operation in a partial safe mode according to an embodiment.

FIG. 3 depicts an exemplary and non-limiting illustrative diagram 300 of operation in a partial safe mode according to an embodiment. In this case two IO pads, 310-A and 310-C are determined by the control signals from 240 to operate safely and therefore receive output signals which are safe. The two other IO pads, namely IO pads 310-B and 310-D, are determined not to be safe and therefore are controlled by 240 so as not to provide signals from 230 as the signals cannot be confirmed to be properly operating. Therefore the circuit is in a partial safe mode. The partial safe mode applies the configured safe output enable only on the IOs that have been programmed to commute when the partial safe mode is actuated. Before applying the partial safe mode each IO is configured to the appropriate desired mode. Similar mapping between elements of FIG. 3 to FIG. 1 can be shown, such as was shown with respect of FIG. 2.

Figure 4:
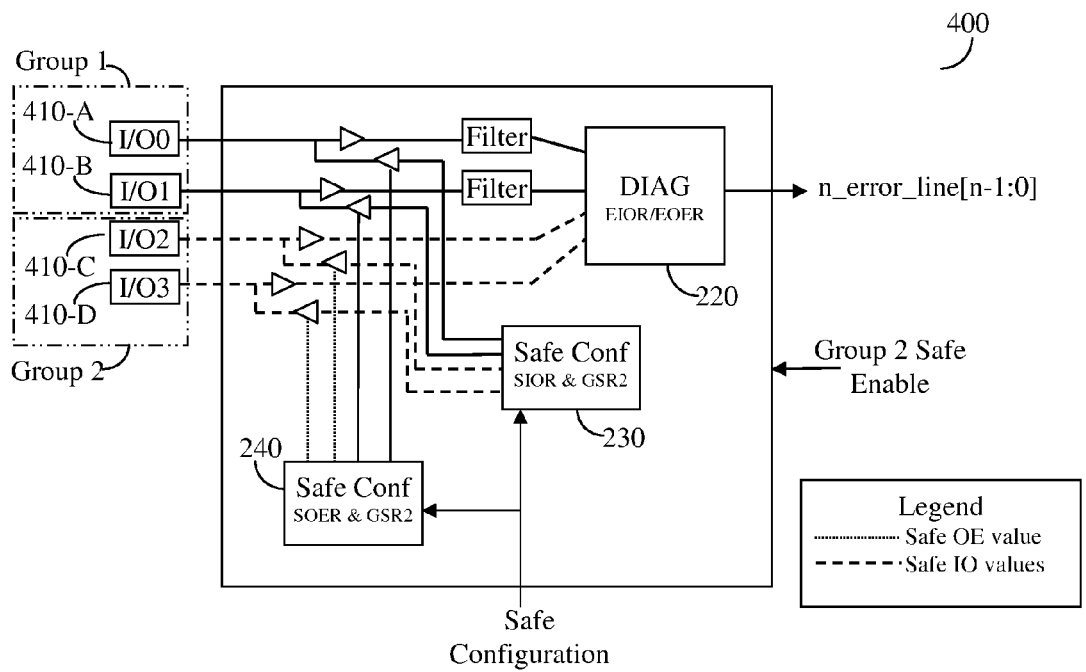
FIG. 4 is an illustrative diagram of operation in a group safe mode according to an embodiment.

FIG. 4 shows an exemplary and non-limiting illustrative diagram 400 of operation in a group safe mode according to an embodiment. In this case the four pads 410 of an IC are grouped into two groups, in group 1 are the IO pads 410-A and 410-B and in group 2 are the IO pads 410-C and 410-D. The control of each of these IO pad groups is performed under the control of signals 240 where the control for each group is identical, i.e., each of the IO pads within a group is treated in the same manner by the control signals and supplied the output signals 230 accordingly. In the group safe mode the safe value and safe output enable are provided therefore only to corresponding groups of IO signals of the actuated group safe line. In one embodiment of the invention the grouping of IO pads 410 into groups is programmable by a user of the IC. Similar mapping between elements of FIG. 4 to FIG. 1 can be shown, such as was shown with respect of FIG. 2.

Figure 5:
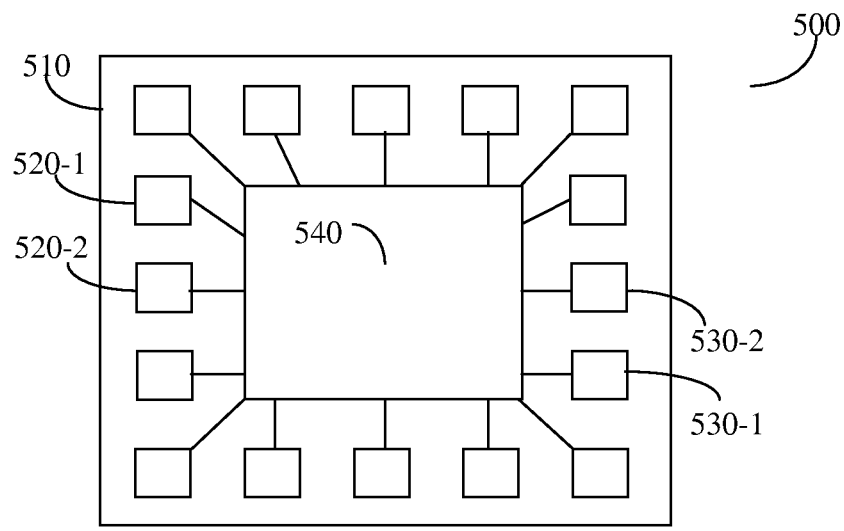
FIG. 5 is a schematic diagram of an integrated circuit equipped with an enhanced IO pad circuitry according to an embodiment.

FIG. 5 depicts an exemplary and non-limiting schematic diagram 500 of an IC 510 equipped with an enhanced IO pad circuitry 520 according to an embodiment. The IC 510 comprises one or more enhance IO pads 520, for example, IO pads 510-1 and 510-n. It should be understood that while all IO pads of the IC 510 may be enhanced IO pads implemented according to the invention, this is not a requirement. In some embodiments one or more of the IO pads shall be enhanced IO pads 520, while other types of IO pads. The IO pads, whether enhanced, such as IO pads 520, or others, such as IO pads 530-1 and 530-2, are connected to the operative circuitry 540 of the IC 510, typically by means of metal paths. Certain control signal to each of the enhanced IO pad 520 may be received from one or more portions of the operative circuitry 540. For example, and without limitations, the APB Bus 161 and the associated APB clock, APB clock enable, and APB hardware reset signals, shown in FIG. 1, respective of an embodiment of an enhanced IO circuitry, are typically provided from the operative circuitry 540. Similarly, other signals shown with respect of the enhanced IO pad in FIG. 1, for example and without limitation, safe clock, safe hardware reset, partial safe status B, Partial safe mode C, Full safe mode A, group safe mode m E, group safe status m D, n_epio_error_line, epio_int, peripheral out 164, peripheral oen 163, peripheral in 162, epio_hw_trig_fe, epio_hw_trig_re 155, and error signal 154, may also be controlled from the operative circuitry 540. It should be noted that the scope of the invention should not be considered to be limited by a particular way by which the control signals are provided to the enhanced IO pad 520.

Figure 6:
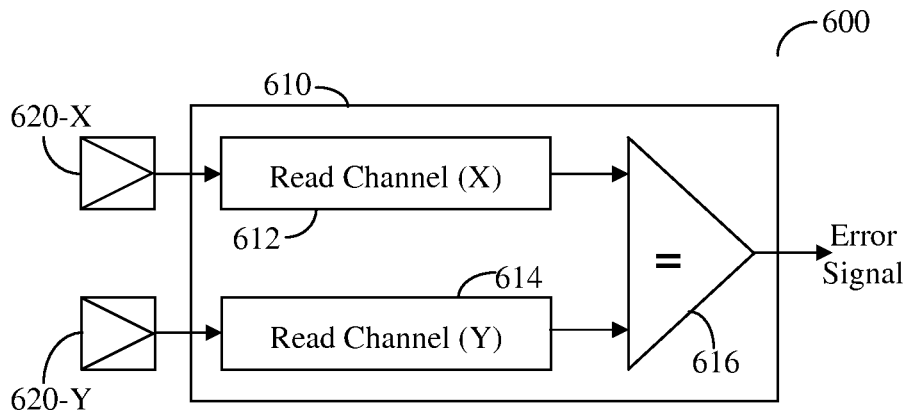
FIG. 6 is a schematic diagram of an enhanced IO pad circuitry for configured handling input redundancy according to an embodiment.

FIG. 6 depicts an exemplary and non-limiting schematic diagram 600 of an enhanced IO pad circuitry 610 configured for handling input redundancy according to an embodiment. Accordingly two or more input pads, for example input pads 620-X and 620-Y, are electrically connected to the enhanced IO pad circuitry 610. The enhanced IO pad circuitry 610 comprises for each input channel a respective read channel, for example, input pad 620-X is electrically connected to the read channel (X) 612 and the input pad 620-Y is electrically connected to the read channel (X) 614. In an embodiment a read channel may include, but is not limited to, a delay line, a first-in-first-out (FIFO) circuitry, and the like, which may or may not be identical for all or some of the read channels. The outputs of the read channels are electrically connected to a comparison circuit 616. The comparison circuit 616 is designed to provide an error signal upon detection that the input signals to the comparison circuit do not have the same value. The error signal could be eventually filtered to avoid glitch generation. The enhanced IO pad circuitry 610 therefore provides functional safety applications with an input redundancy dynamic monitoring circuitry. In one embodiment the delay of any one of the read channels may be programmable. Moreover, programming of each channel may be independent of each other. Programmability may be with respect to the time of the delay, depth of the FIFO circuitry, timing of the FIFO circuitry, and the like.

Figure 7:
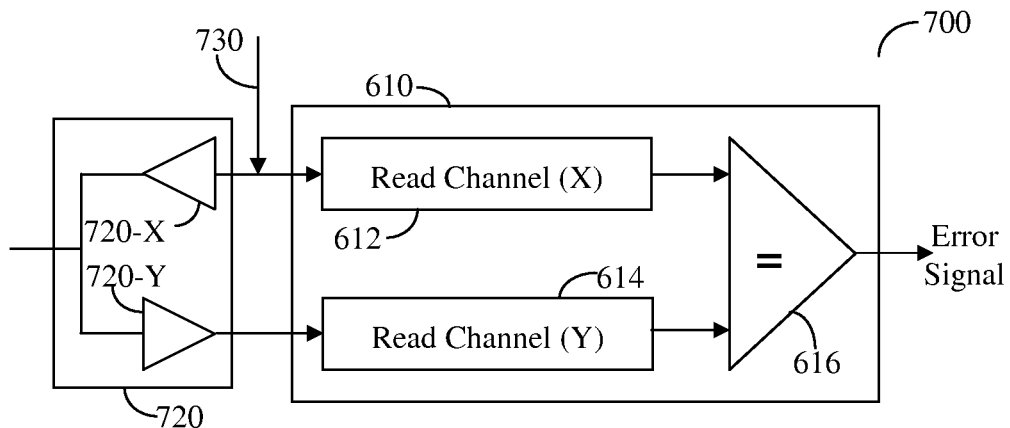
FIG. 7 is a schematic diagram of an enhanced IO pad circuitry configured for handling IO pad monitoring according to an embodiment.

FIG. 7 shows an exemplary and non-limiting schematic diagram 700 of an enhanced IO pad circuitry 610 configured for handling IO pad monitoring according to an embodiment. While the same enhanced IO pad circuitry 610 explained in more detail hereinabove, the configuration of the inputs to the enhanced IO pad circuitry 610 is different. In this case the inputs of the enhanced IO pad circuitry 610 are connected to an IO pad 720 that provides both input and output capabilities under proper control. The output channel 720-X receives its signal 730 from within the IC using the enhanced IO pad circuitry 610. However, as connected, the reach channel (X) 612 also receives the signal 730. The read channel (Y) 614, receives its signal from the IO pad 720 by means of the driver 720-Y. According to an embodiment, the read channel (X) 612 may be programmed to a first delay while the read channel (Y) 614 may be programmed to a different delay. As a result a monitoring of the response to an output signal provided on 730 with respect to an input signal provided by driver 720-Y may be achieved. The relation between the input and the output signal is, according to the invention, programmable, and therefore a response of an output signal value as a result of an input signal value, or a response of an input signal value as a result of an output signal value may be monitored, and an error signal provided at the output of the comparison circuit 616 when these values do not match as predicted. The error signal could be eventually filtered to avoid glitch generation.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. An input/output (IO) pad circuitry of an integrated circuit (IC), the IO pad circuitry comprising:
    an IO pad circuit configured to receive and transmit at least a signal respective of the IC;
    monitoring circuitry connected to the IO pad circuit configured to perform error detection of both a received signal of the IO pad circuit and a transmitted signal of the IO pad circuit; and
    correction circuitry connected to the IO pad circuit configured to override a signal value with a predetermined safe value respective of a predetermined safety mode to ensure that signals provided to and from the IO pad behave correctly such that signals propagated into and out of the IC via the IO pad circuit do not disrupt the operation of the IC and the other components of the system externally connected to the IO pad circuit.

2. The IO pad circuitry of claim 1, wherein the predetermined safety mode is selected from at least one of: full safe mode, partial safe mode, group safe mode.

3. The IO pad circuitry of claim 1, wherein the monitoring circuitry detects at least one of: an undesirable input enable level, an undesirable output enable level, an undesirable input sequence.

4. An integrated circuit (IC) comprising:
    an operative circuitry embedded on a substrate of the IC;
    input/output (IO) pad circuitry connected to the operative circuitry, the IO pad circuitry comprising an IO pad circuit to receive and to transmit at least a signal of the IC, a monitoring circuitry connected to the IO pad circuit configured for error detection of at least a received signal of the IO pad circuit and at least a transmitted signal of the IO pad circuit, and a correction circuitry connected to the IO pad circuit configured to override the at least a signal value with a predetermined safe value respective of a predetermined safety mode, ensuring that the signals propagated in and out of the IO pad of the IC do not disrupt the operation of the IC or the operation of peripheral devices and components of any external system connected to the IO pad circuit.

5. The IC of claim 4, wherein the predetermined safety mode is selected from at least one of: full safe mode, partial safe mode, group safe mode.

6. The IC of claim 4, wherein the monitoring circuitry detects at least one of: an undesirable input enable level, an undesirable output enable level, an undesirable input sequence.

7. A method for ensuring that the signals propagated in and out of an IO pad of an integrated circuit (IC) do not disrupt the operation of the IC or the operation of peripheral devices or components connected to the IC that make up a system by correcting a signal respective of an input/output (IO) pad circuitry of the IC, the method comprising:
    transmitting and receiving a signal at the IO pad respective of the IC;
    monitoring the signal of the IO pad using a monitoring circuitry that is configured with error detection of both the transmitted and received signal; and
    overriding the signal with a predetermined safe value responsive to the detection of an error and respective of a predetermined safety mode using a correction circuitry comprising at least a filter, thereby ensuring correct operation of the IC, and the system comprising the peripheral devices and components connected to the IC through the IO pad.

8. The method of claim 7, further comprising:
selecting the predetermined safety mode from at least one of: full safe mode, partial safe mode, group safe mode.

9. The method of claim 7, wherein the monitoring further comprises:
detecting an undesirable input enable level.

10. The method of claim 7, wherein the monitoring further comprises:
detecting an undesirable output enable level.

11. The method of claim 7, wherein the monitoring further comprises:
detecting an undesirable input sequence.

* * * * *